US008878212B2

(12) United States Patent
Lim et al.

(10) Patent No.: US 8,878,212 B2
(45) Date of Patent: Nov. 4, 2014

(54) LIGHT EMITTING DEVICE, METHOD OF MANUFACTURING THE LIGHT EMITTING DEVICE, LIGHT EMITTING DEVICE PACKAGE, AND LIGHTING SYSTEM

(75) Inventors: Woo Sik Lim, Seoul (KR); Sung Kyoon Kim, Seoul (KR); Sung Ho Choo, Seoul (KR); Hee Young Beom, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 288 days.

(21) Appl. No.: 13/020,041

(22) Filed: Feb. 3, 2011

(65) Prior Publication Data

US 2011/0204399 A1   Aug. 25, 2011

(30) Foreign Application Priority Data

Mar. 17, 2010 (KR) ........................ 10-2010-0023737

(51) Int. Cl.
| H01L 33/00 | (2010.01) |
| H01L 33/48 | (2010.01) |
| H01L 33/62 | (2010.01) |
| H01L 33/60 | (2010.01) |

(52) U.S. Cl.
CPC .............. *H01L 33/62* (2013.01); *H01L 33/486* (2013.01); *H01L 33/0079* (2013.01); *H01L 33/60* (2013.01); *H01L 2224/48091* (2013.01); *H01L 2924/01322* (2013.01)
USPC ............... 257/98; 257/99; 257/100; 257/101; 257/102; 257/103; 257/774; 257/E33.045; 257/E33.06; 257/E33.068; 257/E21.585; 438/118; 438/608; 438/609; 438/637; 438/638; 438/640; 438/672; 438/675

(58) Field of Classification Search
CPC ... H01L 33/0079; H01L 33/46; H01L 33/387; H01L 33/405; H01L 25/167; H01L 33/42; H01L 51/5203

USPC .......... 257/12, 13, 79, 98–103, 774, E33.001, 257/E33.045, E33.06, E33.062, E33.064, 257/E33.068, E23.011, E21.577, E21.578, 257/E21.585; 438/118, 608, 609, 637, 638, 438/640, 672, 675
See application file for complete search history.

(56) References Cited

U.S. PATENT DOCUMENTS

| 2006/0261364 | A1* | 11/2006 | Suehiro et al. ................ 257/100 |
| 2011/0101399 | A1  | 5/2011  | Suehiro et al. |
| 2011/0101405 | A1* | 5/2011  | Chang et al. .................... 257/99 |

FOREIGN PATENT DOCUMENTS

| CN | 1759492 A | 4/2006 |
| CN | 101501842 | 8/2009 |

(Continued)

OTHER PUBLICATIONS

Chinese Office Action dated Dec. 26, 2012 for Application 201110032637.5.

*Primary Examiner* — Meiya Li
(74) *Attorney, Agent, or Firm* — KED & Associates, LLP (57) ABSTRACT

A light emitting device includes a substrate, at least one electrode, a first contact layer, a second contact layer, a light emitting structure layer, and an electrode layer. The electrode is disposed through the substrate. The first contact layer is disposed on a top surface of the substrate and electrically connected to the electrode. The second contact layer is disposed on a bottom surface of the substrate and electrically connected to the electrode. The light emitting structure layer is disposed above the substrate at a distance from the substrate and electrically connected to the first contact layer. The light emitting structure layer includes a first conductive type semiconductor layer, an active layer, and a second conductive type semiconductor layer. The electrode layer is disposed on the light emitting structure layer.

20 Claims, 8 Drawing Sheets

(56) References Cited

FOREIGN PATENT DOCUMENTS

| | | |
|---|---|---|
| JP | 08-255926 A | 10/1996 |
| JP | 2007-67184 A | 3/2007 |
| JP | 2010-153742 A | 7/2010 |
| KR | 10-2005-0093876 A | 9/2005 |
| KR | 10-2007-0037593 A | 6/2008 |
| KR | 10-2008-0051877 A | 6/2008 |
| KR | 10-2008-0057877 A | 6/2008 |

* cited by examiner

LIGHT EMITTING DEVICE, METHOD OF MANUFACTURING THE LIGHT EMITTING DEVICE, LIGHT EMITTING DEVICE PACKAGE, AND LIGHTING SYSTEM

CROSS-REFERENCE TO RELATED APPLICATIONS

The present application claims priority of Korean Patent Application No. 10-2010-0023737 filed on Mar. 17, 2010, which is hereby incorporated by reference in its entirety.

BACKGROUND

The present disclosure relates to a light emitting device, a method of manufacturing a light emitting device, a light emitting device package, and a lighting system.

Light emitting diodes (LED) are semiconductor devices that convert electric energy into light. LEDs are more advantageous in many respects such as low power consumption, a semi-permanent life cycle, a fast response time, safety, and eco-friendly characteristics than light sources of the related art such as a fluorescent lamp and an incandescent bulb. Many studies have been conducted to replace existing light sources with LEDs, and LEDs are being increasingly used as light sources of lighting devices such as indoor and outdoor lamps, liquid crystal displays, electronic boards, and streetlights

SUMMARY

Embodiments provide a light emitting device, a method of manufacturing the light emitting device, a light emitting device package, and a lighting system.

Embodiments also provide a light emitting device having improved light extraction efficiency, a method of manufacturing the light emitting device, a light emitting device package, and a lighting system.

In one embodiment, a light emitting device comprising: a substrate; at least one electrode disposed through the substrate; a first contact layer disposed on a top surface of the substrate and electrically connected to the electrode; a second contact layer disposed on a bottom surface of the substrate and electrically connected to the electrode; a light emitting structure layer disposed above the substrate at a distance from the substrate and electrically connected to the first contact layer, the light emitting structure layer comprising a first conductive type semiconductor layer, an active layer, and a second conductive type semiconductor layer; and an electrode layer on the light emitting structure layer, wherein a transparent conductive layer is disposed between the substrate and the light emitting structure layer.

In another embodiment, a light emitting device comprising: a substrate; at least one electrode disposed through the substrate; a first contact layer disposed on a top surface of the substrate and electrically connected to the electrode; a second contact layer disposed on a bottom surface of the substrate and electrically connected to the electrode; a light emitting structure layer disposed above the substrate at a distance from the substrate and electrically connected to the first contact layer, the light emitting structure layer comprising a first conductive type semiconductor layer, an active layer, and a second conductive type semiconductor layer; and an electrode layer on the light emitting structure layer, wherein a space is formed between the substrate and the light emitting structure layer.

In another embodiment, a light emitting device comprising: a substrate; at least one electrode disposed through the substrate; a first contact layer disposed on a top surface of the substrate and electrically connected to the electrode; a second contact layer disposed on a bottom surface of the substrate and electrically connected to the electrode; a light emitting structure layer disposed above the substrate at a distance from the substrate and electrically connected to the first contact layer, the light emitting structure layer comprising a first conductive type semiconductor layer, an active layer, and a second conductive type semiconductor layer; and an electrode layer on the light emitting structure layer, wherein a lower part of the electrode is wider than an upper part of the electrode.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, with reference to the accompanying drawings, a light emitting device, a method of manufacturing the light emitting device, and a light emitting device package will be described according to exemplary embodiments.

FIGS. 1 to 5 are views for describing a light emitting device 100 and a method of manufacturing the light emitting device 100 according to a first embodiment.

Figure 1:
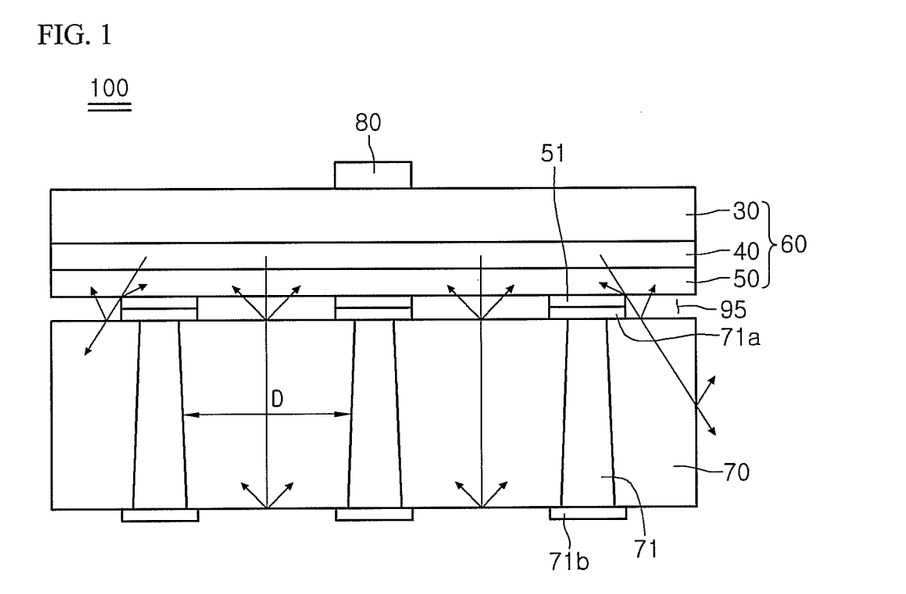
FIGS. 1 to 5 are views for describing a light emitting device and a method of manufacturing the light emitting device according to a first embodiment.

First, the light emitting device 100 of the first embodiment will be described. The light emitting device 100 includes a substrate 70 and a light emitting structure layer 60. An electrode 71 is formed at the substrate 70. The light emitting structure layer 60 includes a first conductive type semiconductor layer 30, an active layer 40, and a second conductive type semiconductor layer 50.

The substrate 70 includes a material less conductive than the electrode 71 or a non-conductive material. The substrate 70 is formed of a transparent material. For example, the substrate 70 may be formed of one of sapphire, glass, GaN, ZnO, and AlN. The substrate 70 may have a thickness of about 0.001 µm to about 500 µm. For example, the substrate 70 may have a thickness of about 20 µm to about 500 µm. The substrate 70 may have a light transmittance of about 50% or more. For example, the substrate 70 may have a light transmittance of about 70% to about 95%.

In addition, the substrate 70 may be formed of a material having a refractive index lower than that of the light emitting structure layer 60. In addition, a pattern (not shown) including concave-convex parts may be formed on the top surface of the substrate 70.

At least one electrode 71 may be formed through the substrate 70 in a vertical direction to electrically upper and lower sides of the substrate 70. No electrode 71 may be formed at a side surface of the substrate 70.

The electrode 71 may include a material having a good electrical conductivity and high reflectivity. For example, the electrode 71 may include at least one of Cu, Ag, Rh, Ni, Au, Pd, Ir, Ti, Pt, W, and Al.

For example, the diameter of the electrode 71 may be in the range from about 0.5 µm to about 50 µm. A lower diameter of the electrode 71 may be greater than an upper diameter of the electrode 71. Alternatively, the upper diameter of the electrode 71 may be greater than the lower diameter of the electrode 71, or the upper and lower diameters of the electrode 71 may be equal.

In addition, for example, a plurality of electrode 71 may be formed. In this case, the interval D between neighboring electrodes 71 may be in the range from about 10 µm to about 300 µm.

The electrode 71 may include a first contact layer 71a disposed at an upper side of the substrate 70 and a second contact layer 71b disposed at a lower side of the substrate 70. The first contact layer 71a and the second contact layer 71b may be wider than the electrode 71.

The first contact layer 71a may be electrically connected to the light emitting structure layer 60 disposed at the upper side of the substrate 70, and the second contact layer 71b may be electrically connected to a circuit pattern (not shown) disposed at the lower side of the substrate 70. The second contact layer 71b may be formed on the entire bottom surface of the substrate 70.

The first contact layer 71a and the second contact layer 71b may be formed of the same material as that used to form the electrode 71 or a material different from that used to form the electrode 71.

An adhesion layer 51 may be further formed under the light emitting structure layer 60. In this case, the first contact layer 71a may be bonded to the adhesion layer 51 disposed under the light emitting structure layer 60. The adhesion layer may be formed of a conductive material such as a metal material.

A space 95 is formed between the light emitting structure layer 60 and the substrate 70. The space 95 may have a thickness corresponding to the thickness of the first contact layer 71a or the thicknesses of the first contact layer 71a and the adhesion layer 51. Air may exist in the space 95. At least parts of the light emitting structure layer 60 and the light emitting structure layer 60 may be spaced apart from each other, or the light emitting structure layer 60 and the substrate 70 may be entirely spaced apart from each other.

The light emitting structure layer 60 may be formed of a compound semiconductor. For example, the light emitting structure layer 60 may be a GaN-based semiconductor layer.

For example, the second conductive type semiconductor layer 50 may be a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as InAlGaN, GaN, AlGaN, InGaN, AlInN, AlN, and InN. The second conductive type semiconductor layer 50 may be doped with a p-type dopant such as Mg and Zn.

The active layer 40 may be formed on the second conductive type semiconductor layer 50. Electrons (or holes) injected through the first conductive type semiconductor layer 30, and holes (or electrons) injected through the second conductive type semiconductor layer 50 may meet at the active layer 40, and as a result, light may be emitted from the active layer 40 according to energy band gap differences of materials forming the active layer 40.

The active layer 40 may have at least one of a single quantum well structure, a multi quantum well (MQW) structure, a quantum wire structure, and a quantum dot structure.

The active layer 40 may be formed of a semiconductor material having a compositional formula of $In_xAl_yGa_{1-x-y}N$ ($0 \leq x \leq 1$, $0 \leq y \leq 1$, $0 \leq x+y \leq 1$). If the active layer 40 has a multi quantum well structure, the active layer 40 may be formed by stacking a plurality of well layers and a plurality of barrier layers. For example, the active layer 40 may have periods of InGaN well layer/GaN barrier layer. The well layers have an energy band gap smaller than that of the barrier layers.

A doped clad layer (not shown) doped with an n-type or p-type dopant may be disposed on and/or under the active layer 40. The clad layer (not shown) may include an AlGaN layer or an InAlGaN layer.

An undoped semiconductor layer may be further formed on the first conductive type semiconductor layer 30. However, the scope of the present disclosure is not limited thereto.

For example, the first conductive type semiconductor layer 30 may include an n-type semiconductor layer. The n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as InAlGaN, GaN, AlGaN, InGaN, AlInN, AlN, and InN. The n-type semiconductor layer may be doped with an n-type dopant such as Si, Ge, and Sn.

Unlike the above description, the first conductive type semiconductor layer 30 may include a p-type semiconductor layer, and the second conductive type semiconductor layer 50 may include an n-type semiconductor layer.

In addition, the first conductive type semiconductor layer 30 and the second conductive type semiconductor layer 50 may be doped with conductive type dopants uniformly or non-uniformly That is, the light emitting structure layer 60 may be formed into various structures but not limited thereto.

An electrode layer 80 may be formed on the first conductive type semiconductor layer 30. The electrode layer 80 may include a pad part and at least one branch part extending from the pad part. However, the electrode layer 80 is not limited thereto. For example, the electrode layer 80 may include at least one of Al, Ti, Cr, Ni, Cu, and Au.

As described above, in the light emitting device 100, if power is applied to the active layer 40 through the electrode layer 80 and the electrode 71, light is emitted from the active layer 40.

As shown by arrows in FIG. 1, some of light generated from the active layer 40 may propagate to a lower side of the second conductive type semiconductor layer 50. Some of the light propagating to the lower side of the second conductive type semiconductor layer 50 may be reflected and refracted at the space 95 formed between the second conductive type semiconductor layer 50 and the substrate 70, and the rest of the light may propagate to a lower part of the substrate 70 where the light may be reflected and refracted.

In the related art, a reflection layer is disposed under the second conductive type semiconductor layer 50. Thus, most of light generated from the active layer 40 and propagating to the lower side of the active layer 40 is reflected back to the active layer 40 by the reflection layer. However, when the light is reflected back to the active layer 40, the light may disappear as the active layer 40 absorbs the light.

However, in the light emitting device 100 of the first embodiment, the space 95 and the substrate 70 having a high light transmittance are provided under the light emitting structure layer 60 so that light emitted from the active layer 40 can be guided to the outside of the light emitting device 100. Therefore, light extraction efficiency can be improved.

Figure 2:
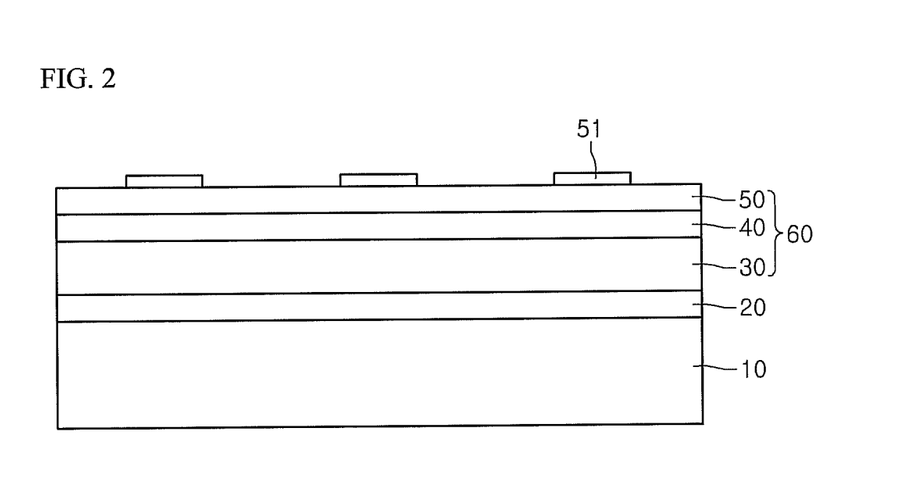

With reference to FIGS. 1 to 5, an explanation will be given of a method of manufacturing of the light emitting device 100 of the first embodiment. As shown in FIG. 2, a buffer layer 20 is formed on a growth substrate 10. Then, a light emitting structure layer 60 including a first conductive type semiconductor layer 30, an active layer 40, and a second conductive type semiconductor layer 50 is formed on the buffer layer 20. Next, a adhesion layer 51 is partially formed on the light emitting structure layer 60.

For example, the growth substrate 10 may include at least one of sapphire, SiC, GaAs, GaN, ZnO, Si, GaP, LiAl$_2$O$_3$, InP, BN, AlN, SiGe, and Ge.

The buffer layer 20 may be formed to reduce defects that may be caused by a lattice constant difference between the growth substrate 10 and the light emitting structure layer 60. The buffer layer 20 may include an undoped nitride layer.

The buffer layer 20 and the light emitting structure layer 60 may be formed on the growth substrate 10 by a method such as a metal organic chemical vapor deposition (MOCVD) method, a chemical vapor deposition (CVD) method, a plasma-enhanced chemical vapor deposition (PECVD), a molecular beam epitaxy (MBE) method, or a hydride vapor phase epitaxy (HVPE) method. However, the method of forming the buffer layer 20 is not limited thereto.

Figure 3:
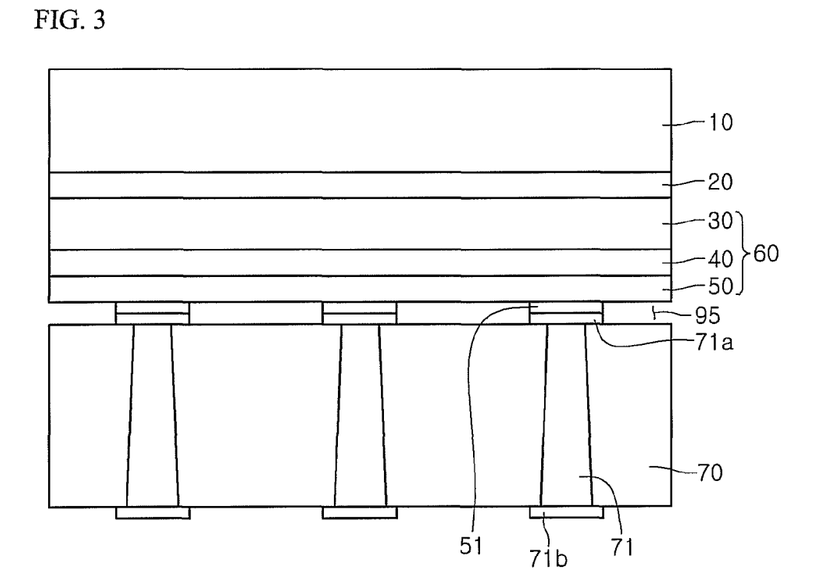

Referring to FIG. 3, a substrate 70 is prepared. At least one via hole is formed in the substrate 70. The via hole may be formed by a laser drilling method or an etching method.

Then, an electrode 71 is formed by filling the via hole with a conductive material by a method such as an E-beam method, a sputtering method, and a plating method.

A first contact layer 71a may be formed on the topside of the substrate 70 in a manner such that the first contact layer 71a is connected to the electrode 71, and a second contact layer 71b may be formed on the bottom side of the substrate 70 in a manner such that the second contact layer 71b is connected to the electrode 71. The first contact layer 71a and the second contact layer 71b may be formed by a method such as an E-beam method, a sputtering method, or a plating method.

The substrate 70 and the light emitting structure layer 60 are bonded together. The first contact layer 71a and the adhesion layer 51 may be disposed at positions corresponding to each other. The substrate 70 and the light emitting structure layer 60 may be bonded together by bonding the first contact layer 71a and the adhesion layer 51. In this case, a space 95 may be formed between the light emitting structure layer 60 and the substrate 70.

Figure 4:
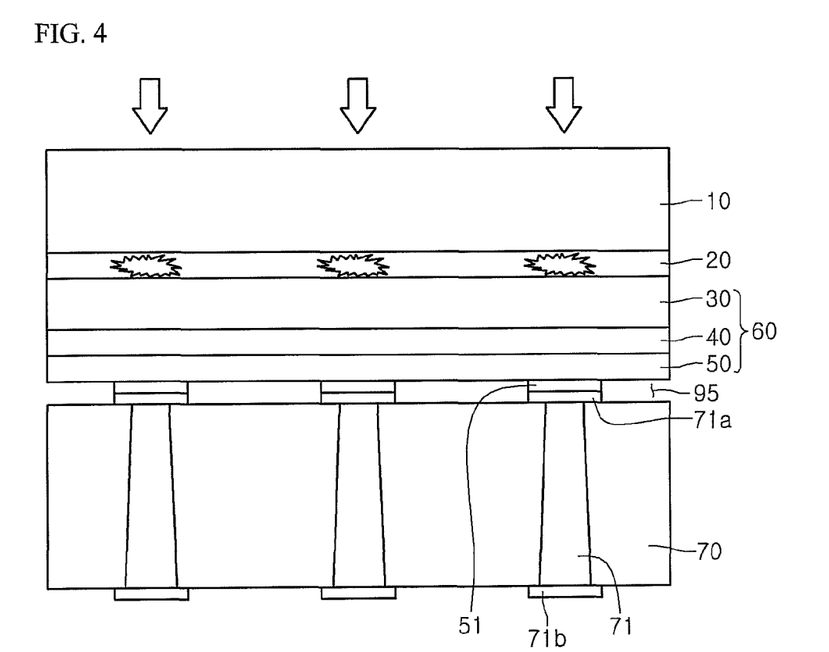
Figure 5:
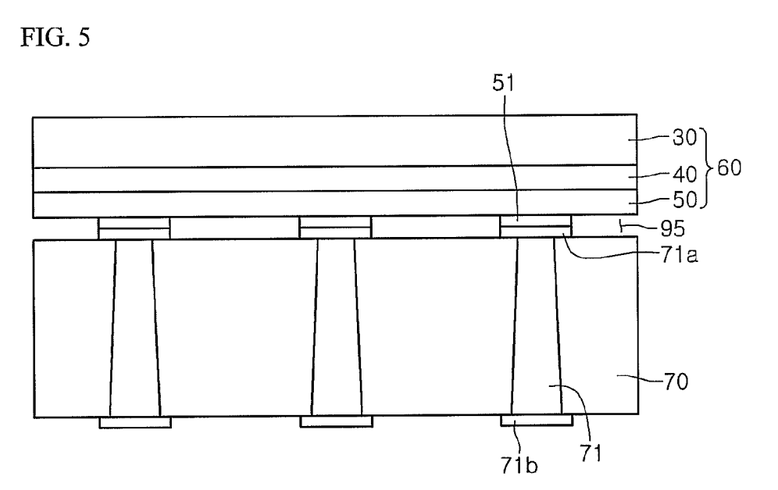

Referring to FIGS. 4 and 5, the growth substrate 10 is removed from the light emitting structure layer 60. The growth substrate 10 may be removed by a laser lift off (LLO) method or a chemical lift off (CLO) method. In this case, the buffer layer 20 may be removed together with the growth substrate 10.

As shown in FIG. 1, an electrode layer 80 is formed on the first conductive type semiconductor layer 30. Before the electrode layer 80 is formed, a rough pattern may be formed on the top surface of the first conductive type semiconductor layer 30 to improve light extraction efficiency.

The electrode layer 80 may be formed by a deposition method or a plating method. However, the method of forming the electrode layer 80 is not limited thereto.

Then, a chip separation process may be performed to separate light emitting devices. For example, the chip separation process may be performed by a laser scribing method or a breaking method.

FIGS. 6 to 10 are views for describing a light emitting device and a method of manufacturing the light emitting device according to a second embodiment.

First, the light emitting device 200 of the second embodiment will be described with reference to FIG. 6. The light emitting device 200 includes a substrate 70 and a light emitting structure layer 60. An electrode 71 is formed at the substrate 70. The light emitting structure layer 60 includes a first conductive type semiconductor layer 30, an active layer 40, and a second conductive type semiconductor layer 50.

The substrate 70 includes a material less conductive than the electrode 71 or a non-conductive material. The substrate 70 is formed of a transparent material. For example, the substrate 70 may be formed of one of sapphire, glass, GaN, ZnO, and AlN. The substrate 70 may have a light transmittance of about 50% or more. For example, the substrate 70 may have a light transmittance of about 70% to about 95%.

In addition, the substrate 70 may be formed of a material having a refractive index lower than that of the light emitting structure layer 60.

In addition, a pattern (not shown) including concave-convex parts may be formed on the top surface of the substrate 70.

At least one electrode 71 may be formed through the substrate 70 to electrically upper and lower sides of the substrate 70. The electrode 71 may include a material having a good electrical conductivity and high reflectivity. For example, the electrode 71 may include at least one of Cu, Ag, Rh, Ni, Au, Pd, Ir, Ti, Pt, W, and Al.

The electrode 71 may include a first contact layer 71a disposed at an upper side of the substrate 70 and a second contact layer 71b disposed at a lower side of the substrate 70. The first contact layer 71a and the second contact layer 71b may be wider than the electrode 71.

The first contact layer 71a may be electrically connected to the light emitting structure layer 60 disposed at the upper side of the substrate 70, and the second contact layer 71b may be electrically connected to a circuit pattern (not shown) disposed at the lower side of the substrate 70. The second contact layer 71b may be formed on the entire bottom surface of the substrate 70.

The first contact layer 71a and the second contact layer 71b may be formed of the same material as that used to form the electrode 71 or a material different from that used to form the electrode 71.

An adhesion layer 51 may be further formed under the light emitting structure layer 60. In this case, the first contact layer 71a may be bonded to the adhesion layer 51 disposed under the light emitting structure layer 60. The adhesion layer may be formed of a conductive material such as a metal material. Alternatively, the adhesion layer 51 may be formed of an insulating material such as spin-on-glass, high-temperature polymer adhesive, and SiO$_2$. In the case where the adhesion layer 51 is formed of an insulating material, the adhesion layer 51 may be positioned to be aligned with the electrode layer 80 in a vertical direction so that the adhesion layer 51 can function as a current blocking layer to change a flow of current. In the light emitting device 200 of the second embodiment, the adhesion layer 51 can be formed of an insulating material because a transparent conductive layer 90 is formed.

A transparent conductive layer 90 is formed between the light emitting structure layer 60 and the substrate 70. The transparent conductive layer 90 may have a thickness corresponding to the thickness of the first contact layer 71a or the thicknesses of the first contact layer 71a and the adhesion layer 51.

The transparent conductive layer 90 may include at least one of a transparent conductive oxide, a transparent conductive nitride, and a transparent conductive oxide nitride. For example, the transparent conductive oxide may be one of ITO (Indium-Tin Oxide), ZnO, AZO (Aluminum doped Zinc Oxide), IZO (Indium Zinc Oxide), ATO (Antimony Tin Oxide), ZITO (Zinc Indium-Tin Oxide), Sn—O, In—O, and Ga—O. The transparent conductive nitride may be at least one of TiN, CrN, TaN, and In—N. The transparent conductive oxide nitride may be one of ITON (Indium-Tin Oxide Nitride), ZnON, O—In—N, and IZON (Indium Zinc Oxide Nitride).

The thickness of the transparent conductive layer 90 may be greater than the thickness of the adhesive layer 51 and may correspond to the thickness of the adhesive layer 51 and the first contact layer 71a.

In the case where the adhesive layer 51 is not formed, the thickness of the transparent conductive layer 90 may correspond to the thickness of the first contact layer 71a.

In the embodiment, the adhesive layer 51 may make contact with the second conductive type semiconductor layer 50 as a first material layer, the transparent conductive layer 90 may make contact with the second conductive type semiconductor layer as a second material layer having an electric conductivity different from that of the first material layer. Since the adhesive layer 51 and the transparent conductive layer 90 have different electric conductivities, distribution of currents flowing in the light emitting structure layer 60 can be changed. Particularly, it is allowed to forming the adhesive layer 51 using an insulating material.

The light emitting structure layer 60 may be formed of a compound semiconductor. For example, the light emitting structure layer 60 may be a GaN-based semiconductor layer.

For example, the second conductive type semiconductor layer 50 may be a p-type semiconductor layer. The p-type semiconductor layer may be formed of a semiconductor material having a compositional formula of $In_xAl_yGa_{1-x-y}N$ ($0 \le x \le 1$, $0 \le y \le 1$, $0 \le x+y \le 1$) such as InAlGaN, GaN, AlGaN, InGaN, AlInN, AlN, and InN. The second conductive type semiconductor layer 50 may be doped with a p-type dopant such as Mg and Zn.

The active layer 40 may be formed on the second conductive type semiconductor layer 50. Electrons (or holes) injected through the first conductive type semiconductor layer 30, and holes (or electrons) injected through the second conductive type semiconductor layer 50 may meet at the active layer 40, and as a result, light may be emitted from the active layer 40 according to energy band gap differences of materials forming the active layer 40.

The active layer 40 may have at least one of a single quantum well structure, a multi quantum well (MQW) structure, a quantum wire structure, and a quantum dot structure.

The active layer 40 may be formed of a semiconductor material having a compositional formula of $In_xAl_yGa_{1-x-y}N$ ($0 \le x \le 1$, $0 \le y \le 1$, $0 \le x+y \le 1$). If the active layer 40 has a multi quantum well structure, the active layer 40 may be formed by stacking a plurality of well layers and a plurality of barrier layers. For example, the active layer 40 may have periods of InGaN well layer/GaN barrier layer.

A doped clad layer (not shown) doped with an n-type or p-type dopant may be disposed on and/or under the active layer 40. The clad layer (not shown) may include an AlGaN layer or an InAlGaN layer.

An undoped semiconductor layer may be further formed on the first conductive type semiconductor layer 30. However, the scope of the present disclosure is not limited thereto.

For example, the first conductive type semiconductor layer 30 may include an n-type semiconductor layer. The n-type semiconductor layer may be formed of a semiconductor material having a compositional formula of $In_xAl_yGa_{1-x-y}N$ ($0 \le x \le 1$, $0 \le y \le 1$, $0 \le x+y \le 1$) such as InAlGaN, GaN, AlGaN, InGaN, AlInN, AlN, and InN. The n-type semiconductor layer may be doped with an n-type dopant such as Si, Ge, and Sn.

Unlike the above description, the first conductive type semiconductor layer 30 may include a p-type semiconductor layer, and the second conductive type semiconductor layer 50 may include an n-type semiconductor layer.

In addition, the first conductive type semiconductor layer 30 and the second conductive type semiconductor layer 50 may be doped with conductive type dopants uniformly or non-uniformly That is, the light emitting structure layer 60 may be formed into various structures but not limited thereto.

An electrode layer 80 may be formed on the first conductive type semiconductor layer 30. The electrode layer 80 may include a pad part and at least one branch part extending from the pad part. However, the electrode layer 80 is not limited thereto. For example, the electrode layer 80 may include at least one of Al, Ti, Cr, Ni, Cu, and Au.

As described above, in the light emitting device 200 of the second embodiment, if power is applied to the active layer 40 through the electrode layer 80 and the electrode 71, light is emitted from the active layer 40.

Figure 6:
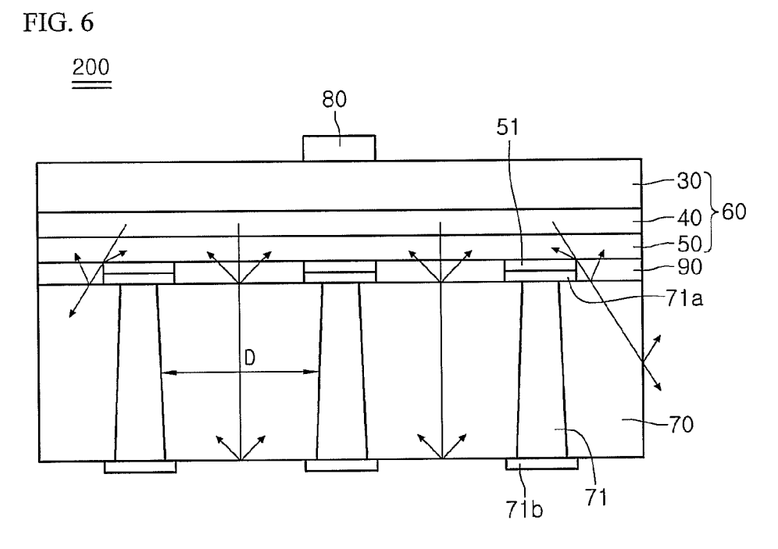
FIGS. 6 to 10 are views for describing a light emitting device and a method of manufacturing the light emitting device according to a second embodiment.

As shown by arrows in FIG. 6, some of light generated from the active layer 40 may propagate to a lower side of the second conductive type semiconductor layer 50. Some of the light propagating to the lower side of the second conductive type semiconductor layer 50 may be reflected and refracted at the transparent conductive layer 90 formed between the second conductive type semiconductor layer 50 and the substrate 70, and the rest of the light may propagate to a lower part of the substrate 70 where the light may be reflected and refracted.

In the related art, a reflection layer is disposed under the second conductive type semiconductor layer 50. Thus, some of light generated from the active layer 40 may be reflected back to the active layer 40 by the reflection layer. However, when the light is reflected back to the active layer 40, the light may disappear as the active layer 40 absorbs the light.

However, in the light emitting device 200 of the second embodiment, the transparent conductive layer 90 and the substrate 70 having a high light transmittance are provided under the light emitting structure layer 60 so that light emitted from the active layer 40 can be guided to the outside of the light emitting device 200. Therefore, light extraction efficiency can be improved.

The light emitting structure layer 60 may have a refractive index of about 2.4, the transparent conductive layer 90 may have a refractive index of about 2.0, and the substrate 70 may have a refractive index of about 1.5. That is, the transparent conductive layer 90 may have a refractive index lower than that of the light emitting structure layer 60, and the substrate 70 may have a refractive index lower than that of the transparent conductive layer 90.

Therefore, light generated from the active layer 40 can propagate to the substrate 70 more effectively owing to the refractive index differences, and thus the light can be easily extracted through the substrate 70.

Figure 7:
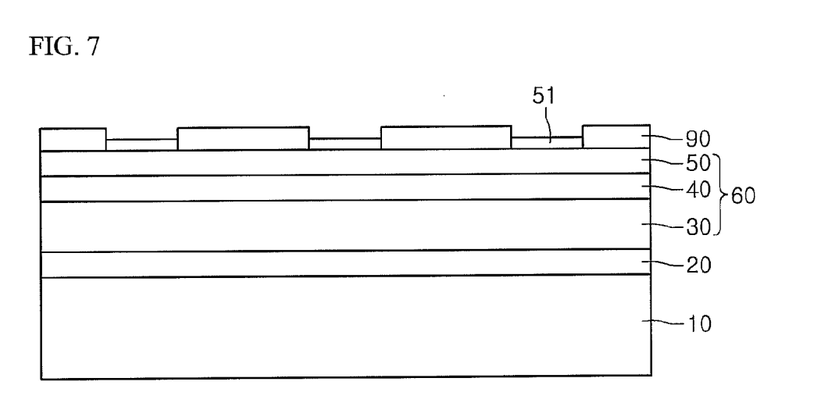

With reference to FIGS. 6 to 10, an explanation will be given of a method of manufacturing of the light emitting device 200 of the second embodiment. As shown in FIG. 7, a buffer layer 20 is formed on a growth substrate 10. Then, a light emitting structure layer 60 including a first conductive type semiconductor layer 30, an active layer 40, and a second conductive type semiconductor layer 50 is formed on the buffer layer 20.

A transparent conductive layer 90 may be partially formed on the light emitting structure layer 60, and an adhesive layer 51 may be formed between parts of the light emitting structure layer 60. The adhesive layer 51 may be formed to a thickness smaller than that of the transparent conductive layer 90.

For example, the growth substrate 10 may include at least one of sapphire, SiC, GaAs, GaN, ZnO, Si, GaP, LiAl2O3, InP, BN, AlN, SiGe, and Ge.

The buffer layer 20 may be formed to reduce defects that may be caused by a lattice constant difference between the growth substrate 10 and the light emitting structure layer 60. The buffer layer 20 may include an undoped nitride layer.

The buffer layer 20 and the light emitting structure layer 60 may be formed on the growth substrate 10 by a method such as a metal organic chemical vapor deposition (MOCVD) method, a chemical vapor deposition (CVD) method, a plasma-enhanced chemical vapor deposition (PECVD), a molecular beam epitaxy (MBE) method, or a hydride vapor phase epitaxy (HVPE) method. However, the method of forming the buffer layer 20 is not limited thereto.

Figure 8:
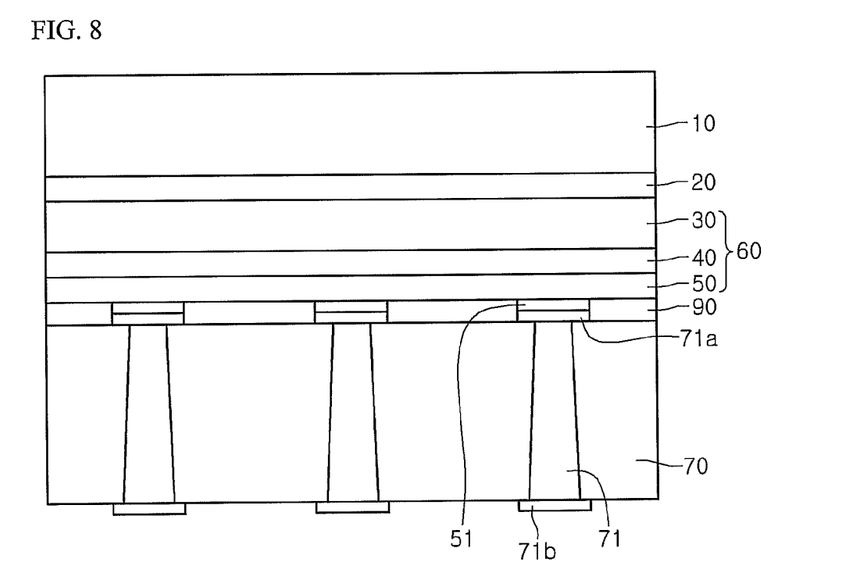

Referring to FIG. 8, a substrate 70 is prepared. At least one via hole is formed in the substrate 70. The via hole may be formed by a laser drilling method or an etching method.

Then, a electrode 71 is formed by filling the via hole with a conductive material by a method such as an E-beam method, a sputtering method, and a plating method.

A first contact layer 71a may be formed on the topside of the substrate 70 in a manner such that the first contact layer 71a is connected to the electrode 71, and a second contact layer 71b may be formed on the bottom side of the substrate 70 in a manner such that the second contact layer 71b is connected to the electrode 71. The first contact layer 71a and the second contact layer 71b may be formed by a method such as an E-beam method, a sputtering method, or a plating method.

The substrate 70 and the light emitting structure layer 60 are bonded together. The first contact layer 71a and the adhesion layer 51 may be disposed at positions corresponding to each other. The substrate 70 and the light emitting structure layer 60 may be bonded together by bonding the first contact layer 71a and the adhesion layer 51. In this case, the transparent conductive layer 90 is disposed between the light emitting structure layer 60 and the substrate 70.

Figure 9:
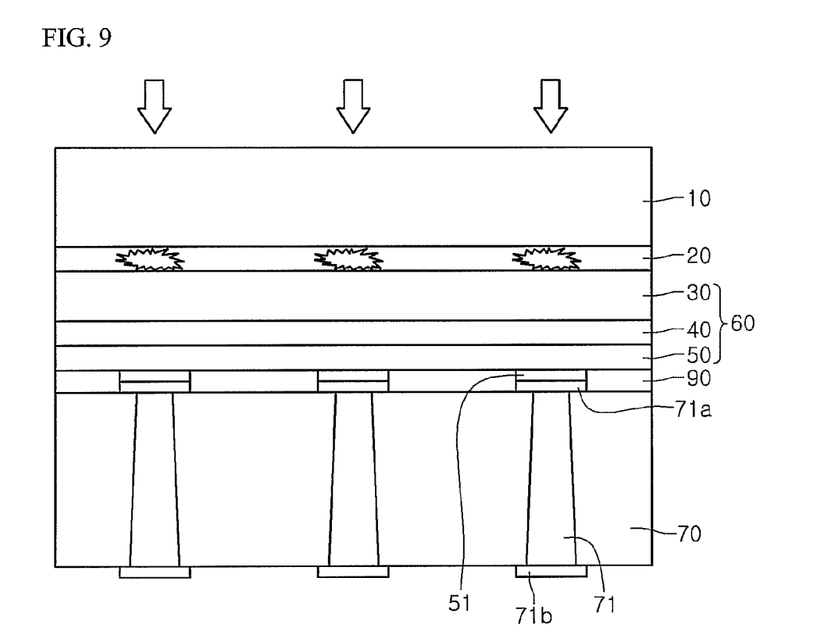
Figure 10:
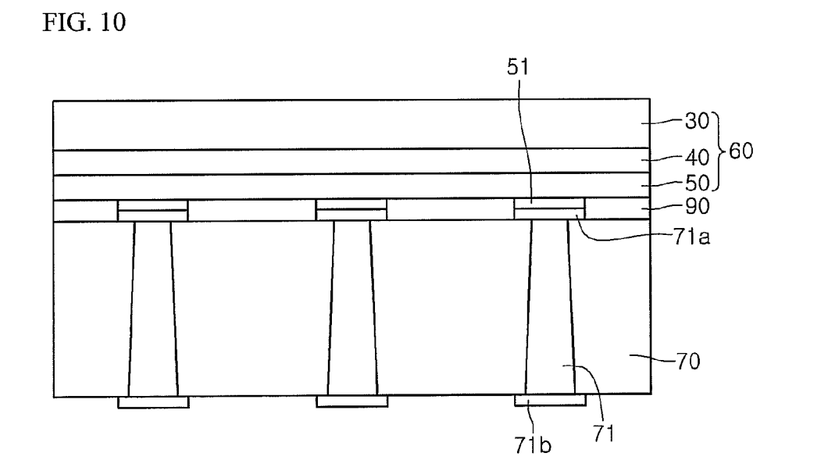

Referring to FIGS. 9 and 10, the growth substrate 10 is removed from the light emitting structure layer 60. The growth substrate 10 may be removed by a laser lift off (LLO) method or a chemical lift off (CLO) method. In this case, the buffer layer 20 may be removed together with the growth substrate 10.

As shown in FIG. 6, an electrode layer 80 is formed on the first conductive type semiconductor layer 30. Before the electrode layer 80 is formed, a rough pattern may be formed on the top surface of the first conductive type semiconductor layer 30 to improve light extraction efficiency.

The electrode layer 80 may be formed by a deposition method or a plating method. However, the method of forming the electrode layer 80 is not limited thereto.

Then, a chip separation process may be performed to separate light emitting devices. For example, the chip separation process may be performed by a laser scribing method or a breaking method.

Figure 11:
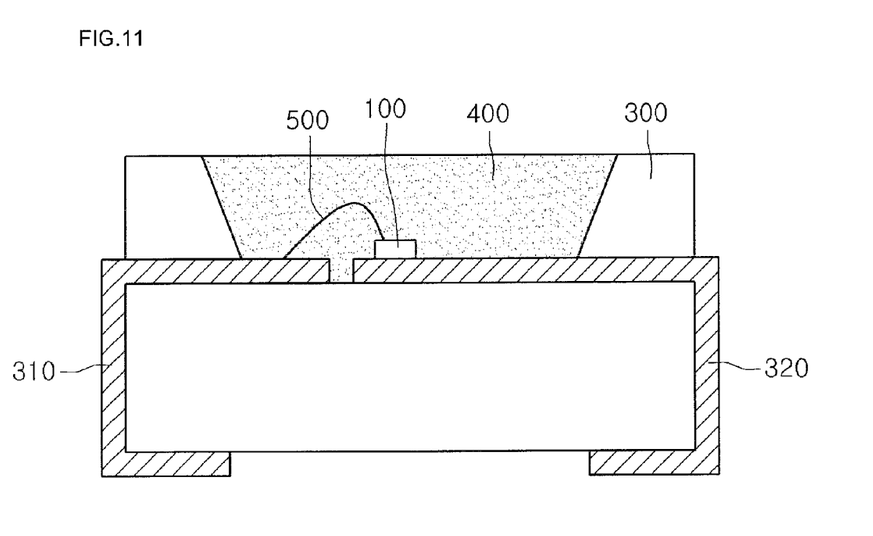
FIG. 11 is a view illustrating a light emitting device package according to an embodiment.

FIG. 11 is a view illustrating a light emitting device package according to an embodiment.

Referring to FIG. 11, the light emitting device package of the current embodiment includes: a package body 300; first and second conductive layers 310 and 320 disposed on the package body 300; a light emitting device 100 disposed on the package body 300 and electrically connected to the first and second conductive layers 310 and 320; and a molding member 400 surrounding the light emitting device 100.

The package body 300 may include a silicon material, a synthetic resin material, or a metal material. The package body 300 may include a sloped surface disposed around the light emitting device 100.

The first and second conductive layers 310 and 320 are electrically separated from each other and supply power to the light emitting device 100. In addition, the first and second conductive layers 310 and 320 may reflect light generated from the light emitting device 100 to increase light efficiency and may dissipate heat generated in the light emitting device 100 to the outside.

The light emitting device 100 may be disposed on the package body 300, the first conductive layer 310, or the second conductive layer 320. The light emitting device 100 may have the same structure as that of the light emitting device 100 of the first embodiment explained with reference to FIGS. 1 to 5. Alternatively, the light emitting device 100 may have the same structure as that of the light emitting device 200 of the second embodiment explained with reference to FIGS. 6 to 10.

In the light emitting device 100, a second contact layer 71b may be formed on the bottom side of a substrate 70. The second contact layer 71b may be bonded to the second conductive layer 320 by a eutectic bonding method. Therefore, heat generated in the light emitting device 100 may be effectively transmitted to the second conductive layer 320 through an electrode 71 and the second contact layer 71b.

The light emitting device 100 may be electrically connected to the first conductive layer 310 and the second conductive layer 320 by a method such as a wire bonding method, a die bonding method, and a flip chip bonding method, to generate light. However, the scope of the present disclosure is not limited thereto. In the embodiment, the light emitting device 100 is electrically connected to the first conductive layer 310 through a wire 500 and to the second conductive layer 320 through a direct contact.

The molding member 400 may surround the light emitting device 100 to protect the light emitting device 100. In addition, a phosphor may be contained in the molding member 400 to change the wavelength of light emitted from the light emitting device 100.

In an embodiment, a plurality of light emitting device packages may be arranged on a substrate, and optical members such as a light guide panel, a prism sheet, a diffusion sheet, and a fluorescence sheet may be disposed on a path of light emitted from the light emitting devices. The light emitting device packages, the substrate, and the optical members may function as a backlight unit or lighting unit. For example, the lighting system may include a backlight unit, a lighting unit, an indicator unit, a lamp, a streetlamp, etc.

Figure 12:
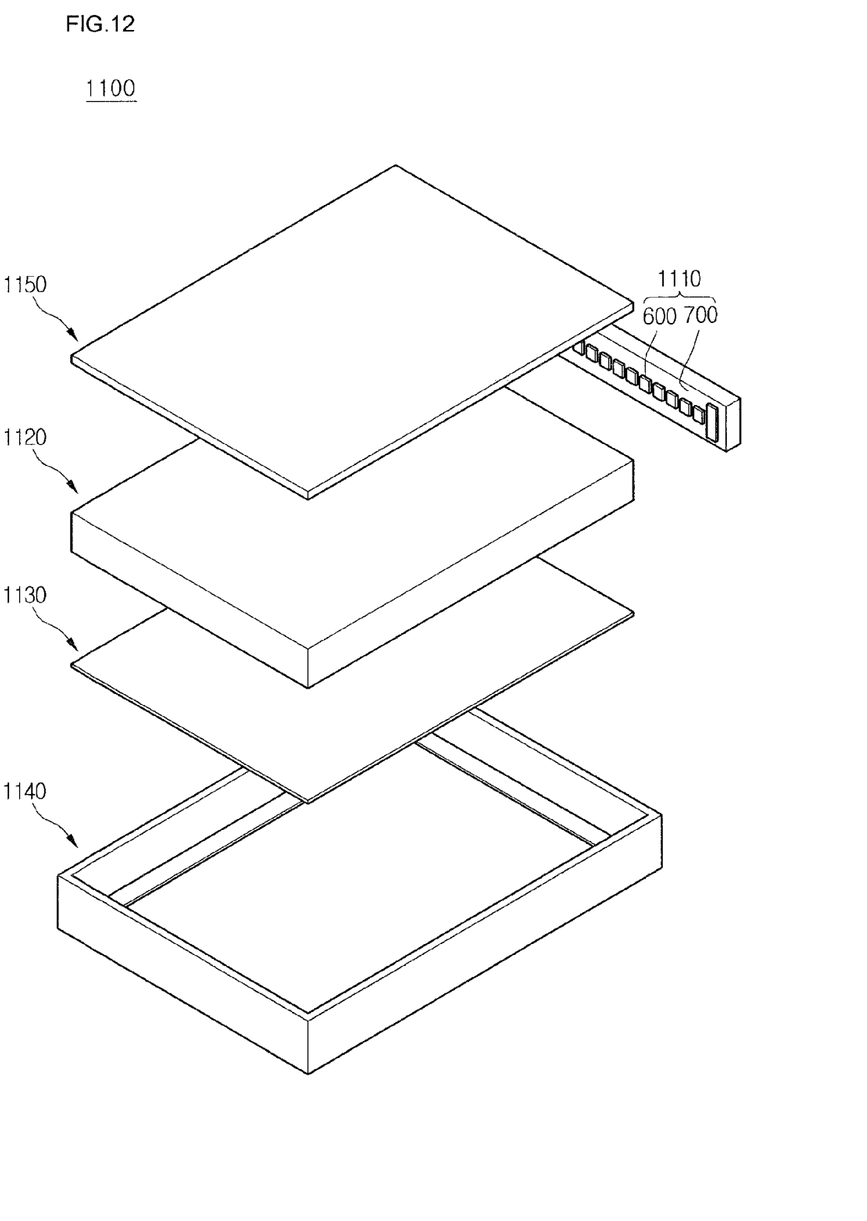
FIG. 12 is a view of a backlight unit including light emitting devices or light emitting device packages according to an embodiment.

FIG. 12 is a view including a backlight unit 1100 including light emitting devices or light emitting device packages according to an embodiment. However, the backlight unit 1100 of the FIG. 12 is an example of a lighting system, and the scope of the present disclosure is not limited thereto.

Referring to FIG. 12, the backlight unit 1100 may include a bottom frame 1140, a light guide member 1120 disposed within the bottom frame 1140, and a light emitting module 1110 disposed on at least one side surface or the bottom surface of the light guide member 1120. In addition, a reflection sheet 1130 may be disposed under the light guide member 1120.

The bottom frame 1140 may have a box shape with an opened topside to accommodate the light guide member 1120, the light emitting module 1110, and the reflection sheet 1130. The bottom frame 1140 may be formed of a metal material or a resin material, but is not limited thereto.

The light emitting module 1110 may include a board 700 and a plurality of light emitting device packages 600 disposed on the board 700. The plurality of light emitting device packages 600 may provide light to the light guide member 1120. Although the light emitting module 1110 in which the light emitting device packages 600 are disposed on the board 700 is provided as an example in the current embodiment, the scope of the present disclosure is not limited thereto. For example, light emitting devices 200 of the previous embodiment may be directly disposed.

As shown in FIG. 12, the light emitting module 1110 may be disposed on at least one of inner surfaces of the bottom frame 1140. In this state, the light emitting module 1110 may provide light toward at least one side surface of the light guide member 1120.

Alternatively, the light emitting module 1110 may be disposed on the bottom surface of the bottom frame 1140 to provide light toward the bottom surface of the light guide member 1120. The position of the light emitting module 1110 may be variously varied according to the design of the backlight unit 1100. That is, the scope of the present disclosure is not limited thereto.

The light guide member 1120 may be disposed within the bottom frame 1140. The light guide member 1120 may receive light from the light emitting module 1110 and guide the light to a display panel (not shown) as surface light.

For example, the light guide member 1120 may be a light guide panel (LGP). The LGP may be formed of an acryl-based resin such as polymethylmethacrylate (PMMA) or one of polyethylene terephthlate (PET), poly carbonate (PC), cyclic olefin copolymer (COC), and polyethylene naphthalate (PEN).

An optical sheet 1150 may be disposed above the light guide member 1120.

For example, the optical sheet 1150 may include at least one of a diffusion sheet, a condensing sheet, a brightness enhancement sheet, and a fluorescence sheet. For example, the optical sheet 1150 may be formed by sequentially stacking such a diffusion sheet, a condensing sheet, a brightness enhancement sheet, and a fluorescence sheet. In this case, the optical sheet 1150 may uniformly diffuse light emitted from the light emitting module 1110, and the diffused light may be condensed on the display panel (not shown) by the condensing sheet. Here, light output through the condensing sheet is randomly polarized light. The brightness enhancement sheet may enhance polarization of the light output through the condensing sheet. For example, the condensing sheet may be a horizontal and/or vertical prism sheet. Also, the brightness enhancement sheet may be a dual brightness enhancement film. The fluorescence sheet may be a transparent plate or film including a phosphor.

The reflection sheet 1130 may be disposed under the light guide member 1120. The reflection sheet 1130 may reflect light emitted through the bottom surface of the light guide member 1120 toward a light exit surface of the light guide member 1120.

The reflection sheet 1130 may be formed of a resin material having a high reflectivity such as PET, PC, and PVC resins, but is not limited thereto.

Figure 13:
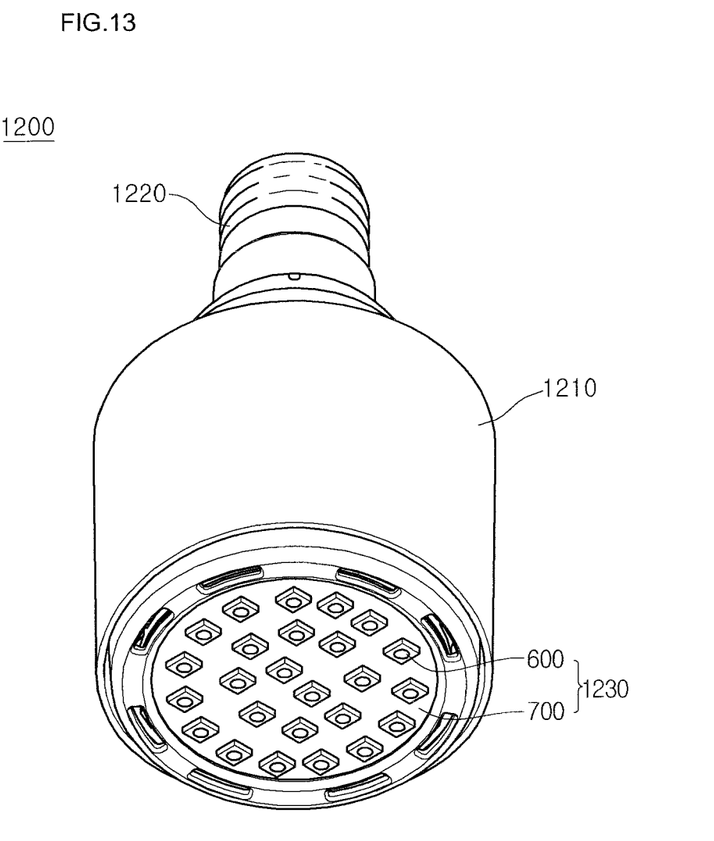
FIG. 13 is a perspective view illustrating a lighting unit including light emitting devices or light emitting device packages according to an embodiment.

FIG. 13 is a perspective view illustrating a lighting unit 1200 including light emitting devices or light emitting device packages according to an embodiment. The lighting unit 1200 shown in FIG. 13 is an example of lighting systems. That is, the scope of the present disclosure is not limited thereto.

Referring to FIG. 13, the lighting unit 1200 may include a case body 1210, a light emitting module 1230 disposed at the case body 1210, a connection terminal 1220 disposed on the case body 1210 to receive power from an external power source.

The case body 1210 may be formed of a material having good heat dissipation characteristics, such as a metal material or a resin material.

The light emitting module 1230 may include a board 700 and at least one light emitting device package 600 mounted on the board 700. Although the light emitting module 1230 in which the light emitting device packages 600 are disposed on the board 700 is provided as an example in the current embodiment, the scope of the present disclosure is not limited thereto. For example, light emitting devices 200 of the previous embodiment may be directly disposed.

The board 700 may be formed by printing a circuit pattern on an insulating material. For example, the board 700 may include a printed circuit board (PCB), a metal core PCB, a flexible PCB, and a ceramic PCB.

In addition, the board 700 may be formed of a material capable of efficiently reflecting light. Alternatively, the board 700 may have a surface having a color capable of efficiently reflecting light, such as a white color, or a silver color.

At least one light emitting device package 600 may be disposed on the board 700. The light emitting device package 600 may include at least one light emitting diode (LED). Examples of the LED include: a color diode capable of emitting color light such as red light, green light, blue light, or white light; and an ultraviolet (UV) LED capable of emitting a UV ray.

The light emitting module 1230 may have various combinations of the LEDs to provide color impression and brightness. For example, the light emitting module 1230 may include a combination of a white LED, a red LED, and a green LED to secure a high color rendering index (CRI). Also, a fluorescence sheet may be further disposed on a path of light emitted from the light emitting module 1230 to change the wavelength of the light emitted from the light emitting module 1230. For example, when light emitted from the light emitting module 1230 has a blue wavelength band, the fluorescence sheet may include a yellow phosphor. In this case, light emitted from the light emitting module 1230 may become white light after passing through the fluorescence sheet.

The connection terminal 1220 may be electrically connected to the light emitting module 1230 to supply power. Referring to FIG. 13, the connection terminal 1220 may be screw-coupled to a socket of an external power source, but is not limited thereto. For example, the connection terminal 1220 may be formed in a pin shape. In this case, the connection terminal 1220 may be inserted into an external power source or connected to the external power source through a cable.

As described above, in the lighting system, at least one of a light guide member, a diffusion sheet, a condensing sheet, a brightness enhancement sheet, and a fluorescence sheet may be disposed on a path of light emitted from the light emitting module 1230 to obtain a predetermined optical effect.

Also, as described above, since the lighting system includes the light emitting device or the light emitting device package having improved light extraction efficiency according to the embodiments, the lighting system can have good optical efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   at least one first electrode disposed through the substrate;
   a first contact layer disposed on a top surface of the substrate and being electrically connected to the first electrode;
   a second contact layer disposed on a bottom surface of the substrate and being electrically connected to the first electrode;
   a light emitting structure layer disposed above the substrate spaced apart from the substrate and being electrically connected to the first contact layer;
   a transparent conductive layer disposed between the substrate and the light emitting structure layer; and
   a second electrode layer on a top surface of the light emitting structure layer,
   wherein the light emitting structure layer includes a first conductive semiconductor layer under the second electrode layer, a second conductive semiconductor layer under the first conductive semiconductor layer and an active layer between the first conductive semiconductor layer and the second conductive semiconductor layer,
   wherein the transparent conductive layer directly contacts the first contact layer,
   wherein the transparent conductive layer is electrically connected to the first contact layer and the second conductive semiconductor layer, and
   wherein the first contact layer is located at a higher position than the top surface of the substrate.

2. The light emitting device according to claim 1, wherein the first contact layer contacts the light emitting structure layer and protrudes from the first electrode.

3. The light emitting device according to claim 1, further comprising an adhesion layer between the first contact layer and the light emitting structure layer, and
   wherein the adhesion layer is formed of an electrical conductive material.

4. The light emitting device according to claim 3, wherein the transparent conductive layer directly contacts the adhesion layer, and
   wherein the transparent conductive layer includes one of a transparent conductive oxide, a transparent conductive nitride and a transparent conductive oxide nitride.

5. The light emitting device according to claim 3, wherein the transparent conductive layer has a thickness greater than that of the adhesion layer.

6. The light emitting device according to claim 3, wherein the transparent conductive layer has a same thickness as a sum of a thickness of the adhesion layer and a thickness of the first contact layer.

7. The light emitting device according to claim 1, wherein the first contact layer has a wider width than the first electrode, and the second contact layer has a wider width than that of the first electrode.

8. The light emitting device according to claim 1, wherein the transparent conductive layer has a refractive index that is less than a refractive index of the light emitting structure layer, and the substrate has a refractive index that is less than the refractive index of the transparent conductive layer.

9. The light emitting device according to claim 1, wherein the transparent conductive layer is surrounded by the substrate, the first contact layer and the light emitting structure layer.

10. The light emitting device according to claim 1, wherein the at least one first electrode includes a plurality of first electrodes, and the plurality of first electrodes are arranged at intervals of 10 μm to 300 μm.

11. The light emitting device according to claim 1, wherein the substrate comprises a material that is less electrically conductive than a material of the first electrode.

12. A light emitting device comprising:
    a substrate;
    at least one first electrode disposed through the substrate;
    a first contact layer disposed on a top surface of the substrate and being electrically connected to the first electrode;
    a second contact layer disposed on a bottom surface of the substrate and being electrically connected to the first electrode;
    a light emitting structure layer disposed above the substrate at a distance from the substrate and being electrically connected to the first contact layer;
    a transparent conductive layer disposed between the substrate and the light emitting structure layer; and
    a second electrode layer on a top surface of the light emitting structure layer,
    wherein a lower part of the first electrode has a wider width than an upper part of the first electrode,
    wherein the light emitting structure layer includes a first conductive semiconductor layer under the second electrode layer, a second conductive semiconductor layer under the first conductive semiconductor layer and an active layer between the first conductive semiconductor layer and the second conductive semiconductor layer, wherein the transparent conductive layer directly contacts the first contact layer and is formed of a material different from the first contact layer, wherein the transparent conductive layer is electrically connected to the first contact layer and the second conductive semiconductor layer, and wherein the first contact layer is located at a higher position than the top surface of the substrate.

13. The light emitting device according to claim 12, wherein the first electrode has a diameter of 0.5 μm to 50 μm.

14. The light emitting device according to claim 12, wherein the first electrode includes a plurality of electrodes, and adjacent ones of the plurality of electrodes are arranged at intervals of 10 μm to 300 μm.

15. The light emitting device according to claim 12, wherein the first contact layer contacts the light emitting structure layer and protrudes from the first electrode.

16. The light emitting device according to claim 12, further comprising an adhesion layer between the first contact layer and the light emitting structure layer, wherein the adhesion layer is formed of an electrical conductive material.

17. The light emitting device according to claim 16, wherein the transparent conductive layer directly contacts the adhesion layer.

18. The light emitting device according to claim 16, wherein the transparent conductive layer has a thickness greater than that of the adhesion layer.

19. The light emitting device according to claim 16, wherein the transparent conductive layer has a same thickness as a sum of a thickness of the adhesion layer and a thickness of the first contact layer.

20. The light emitting device according to claim 12, wherein the transparent conductive layer is surrounded by the substrate, the first contact layer and the light emitting structure layer.

* * * * *